United States Patent
Liu et al.

(10) Patent No.: US 9,005,357 B2
(45) Date of Patent: Apr. 14, 2015

(54) METHOD OF PREPARING MOLYBDENUM OXIDE FILMS

(71) Applicant: Agency for Science, Technology and Research, Singapore (SG)

(72) Inventors: Hongjun Liu, Singapore (SG); Wei Peng Goh, Singapore (SG); Jie Zhang, Singapore (SG); Ziyu Jin, Singapore (SG); Sing Yang Chiam, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/898,826

(22) Filed: May 21, 2013

(65) Prior Publication Data

US 2013/0313534 A1 Nov. 28, 2013

(30) Foreign Application Priority Data

May 24, 2012 (SG) .............................. 201203804-8

(51) Int. Cl.
*C09D 11/00* (2014.01)
*C23C 18/00* (2006.01)
*H01L 51/50* (2006.01)
*H01L 31/032* (2006.01)
*C09D 11/52* (2014.01)

(52) U.S. Cl.
CPC ............ *H01L 51/5056* (2013.01); *C23C 18/00* (2013.01); *C09D 11/00* (2013.01); *H01L 31/032* (2013.01); *H01L 51/5068* (2013.01); *C09D 11/52* (2013.01)

(58) Field of Classification Search
CPC ...... C09D 11/00; C09D 11/52; H01L 31/032; C23C 18/00

USPC ......... 106/286.1, 286.2, 286.6, 286.7, 287.18
See application file for complete search history.

(56) References Cited

U.S. PATENT DOCUMENTS

| | | | | |
|---|---|---|---|---|
| 5,226,955 A * | 7/1993 | Owaki | .............................. | 106/3 |
| 7,699,926 B2 * | 4/2010 | Huang | ........................ | 106/286.4 |
| 8,048,608 B2 * | 11/2011 | Jarvis et al. | ................. | 430/270.1 |
| 2009/0047430 A1 * | 2/2009 | Mori et al. | ..................... | 427/256 |
| 2011/0037065 A1 | 2/2011 | Ueno et al. | | |
| 2011/0073005 A1 * | 3/2011 | Ganapathiappan et al. | ......................... | 106/31.28 |

OTHER PUBLICATIONS

Yu Ping Hu, "CN001888134A, Functional molybdate film and its prepn", (Jan. 2007).*
Norrman et al., "Lifetimes of Organic Photovoltaics: Combining Chemical and Physical Characterisation Techniques to Study Degradation Mechanisms," Solar Energy Materials & Solar Cells, vol. 90, pp. 2793-2814, Jun. 27, 2006.
Meyer et al., "MoO3 Films Spin-Coated from a Nanoparticle Suspension for Efficient Hole-Injection in Organic Electronics," Advanced Materials, vol. 23, pp. 70-73, 2011.
Liu et al., "Efficient Polymer Photovoltaic Cells Using Solution-Processed MoO3 as Anode Buffer Layer," Solar Energy Materials & Solar Cells, vol. 94, pp. 842-845, Jan. 25, 2010.

* cited by examiner

*Primary Examiner* — David M Brunsman
(74) *Attorney, Agent, or Firm* — Winstead, P.C.

(57) ABSTRACT

Present invention relates to methods of preparing molybdenum oxide inks and molybdenum oxide films, and use of the molybdenum oxide films as hole-transporting layers in optoelectronic devices. The ink for forming a hybrid molybdenum (VI) oxide ($MoO_3$) film on a substrate comprises an ammonium molybdate, at least one inorganic salt different from ammonium molybdate, and a solvent or a solvent mixture.

13 Claims, 5 Drawing Sheets

METHOD OF PREPARING MOLYBDENUM OXIDE FILMS

CROSS-REFERENCE TO RELATED APPLICATION

This application claims the benefit of priority of Singapore Patent Application No. 201203804-8, filed May 24, 2012, the contents of which being hereby incorporated by reference in its entirety for all purposes.

TECHNICAL FIELD

The invention relates to methods of preparing molybdenum oxide inks and molybdenum oxide films, and use of the molybdenum oxide films as hole-transporting layers in optoelectronic devices.

BACKGROUND

Organic photovoltaic (OPV) cells have seen remarkable progress in the past few decades. OPV devices using a bulk heterojunction (BHJ) based photoactive layer, positioned between an electron-donating semiconducting polymer and an electron-accepting fullerene derivative, are one of the most promising systems in this field. The most well-investigated BHJ based polymer solar cells consists of poly(3-hexylthiophene) and [6,6]-phenyl C61-butyric acid methyl ester (P3HT:PCBM) blend with a power conversion efficiency (PCE) of 5%. In polymer solar cell technology, chemical tailoring allows an endless possibility of engineering a semiconducting polymer with appropriate absorption and charge transport properties. In the last few years, there are varieties of novel low band gap semiconducting polymers, such as 2,7-carbazole based copolymers, and polythiophene derivatives, as an electron donor have been developed for solar cell applications with an aim to enhance the PCE. As a result, the efficiency of polymer solar cells has been steadily improving, with PCE breaking the 9% barrier.

Recent advancements in most OPV technology relies on poly(3,4-ethylenedioxythiophene): poly(styrene sulfonate) (PEDOT:PSS) as the hole-transporting layer. It is commonly adopted as the anode buffer layer in traditional polymer OPV cells due to its high transparency, high work function, smooth morphology and good conductivity. However, there are several disadvantages in using PEDOT:PSS as the hole-transporting layer, particularly with regard to its moisture permeability. As a film, PEDOT:PSS consists of doped conjugated polymer chains. The polymer grains are defined by PSS random coils with PEDOT chains attached. The area between the grains comprises of excess PSS. It has been suggested that the excess PSS can diffuse into the polymeric/organic layer, which will then possibly undergo a chemical reaction, which is undesirable.

In order to circumvent this, PEDOT:PSS has been replaced with metal oxides such as molybdenum (VI) oxide ($MoO_3$), vanadium (V) oxide ($V_2O_5$), and tungsten (VI) oxide ($WO_3$). The replacement of PEDOT:PSS was also mooted in order to improve the charge extraction by improving the built-in potential, hence elevating the overall PCE.

Most attempts to deposit $MoO_3$ were performed via thermal evaporation means. This will be impractical for all solution-processable materials systems for large area electronics and optoelectronics devices. Furthermore, thermal evaporation involves the use of a vacuum chamber, which consumes lots of energy. Since simple large-scale processing is one of the prerequisites for practical large area production application, solution-processed $MoO_3$ is a much more favorable proposition. Solution processability allows the use of methods such as spin-coating, slot die coating, inkjet printing, roll-to-roll manufacturing, for example.

Recently, a method for solution processable $MoO_3$ films spin-coated from a nanoparticle suspension for organic electronics is developed. The $MoO_3$ nanoparticles were pre-prepared and suspended with an undisclosed block copolymer. In another known method synthesizing metal oxide inks and films for electronic devices, the metal oxide, for instance, $MoO_3$, was prepared by oxidizing the metal-ligand inks by heating or light irradiation or active oxygen exposure. The metal-ligand inks were prepared using metal complexes and organic solvents, which consist of carbonyl groups and/or hydroxyl groups. Unfortunately, both preparation methods are time consuming. Toxic organic compounds and solvents were also needed for these processes. In a separate investigation, a solution-processed $MoO_3$ layer for OPV cells was prepared by spin-coating an aqueous $MoO_3$ solution. The solution was prepared from $(NH_4)_6Mo_7O_{24}$ (ammonium molybdate) and hydrochloric acid solution. However, the ink is highly acidic, which can etch the indium tin oxide (ITO) electrodes.

Therefore, there remains a need to provide for alternative solution-based methods of forming molybdenum oxide films for optoelectronic applications.

SUMMARY

In a first aspect, there is disclosed an ink for forming a hybrid molybdenum (VI) oxide ($MoO_3$) film on a substrate, the ink comprising:
an ammonium molybdate;
at least one inorganic salt different from ammonium molybdate; and
a solvent or a solvent mixture.

In various embodiments, the ammonium molybdate is $(NH_4)_6Mo_7O_{24}$.

In various embodiments, the inorganic salt is a metal halide, such as zinc chloride or calcium chloride.

In a second aspect, there is disclosed a method for preparing a molybdenum (VI) oxide ($MoO_3$) coating ink, the method comprising:
mixing a molybdate compound and an inorganic salt in a solution;
mixing a solution of molybdate compound and an inorganic salt;
mixing a molybdate compound and a solution of an inorganic salt; or
mixing a solution of a molybdate compound and a solution of an inorganic salt.

In a third aspect, there is disclosed a method for forming a hybrid molybdenum (VI) oxide ($MoO_3$) film on a substrate, the method comprising:
coating the substrate with an ink to form a film; and
annealing the film,
wherein the ink comprises an ammonium molybdate, at least one inorganic salt different from ammonium molybdate, and a solvent or a solvent mixture.

In a fourth aspect, there is disclosed an optoelectronic device comprising a hybrid molybdenum (VI) oxide ($MoO_3$) film coated substrate formed by coating a substrate with an ink to form a film and annealing the film, wherein the ink comprises an ammonium molybdate, at least one inorganic salt different from ammonium molybdate, and a solvent or a solvent mixture.

BRIEF DESCRIPTION OF THE DRAWINGS

In the drawings, like reference characters generally refer to the same parts throughout the different views. The drawings are not necessarily drawn to scale, emphasis instead generally being placed upon illustrating the principles of various embodiments. In the following description, various embodiments of the invention are described with reference to the following drawings.

DESCRIPTION

Figure 1:
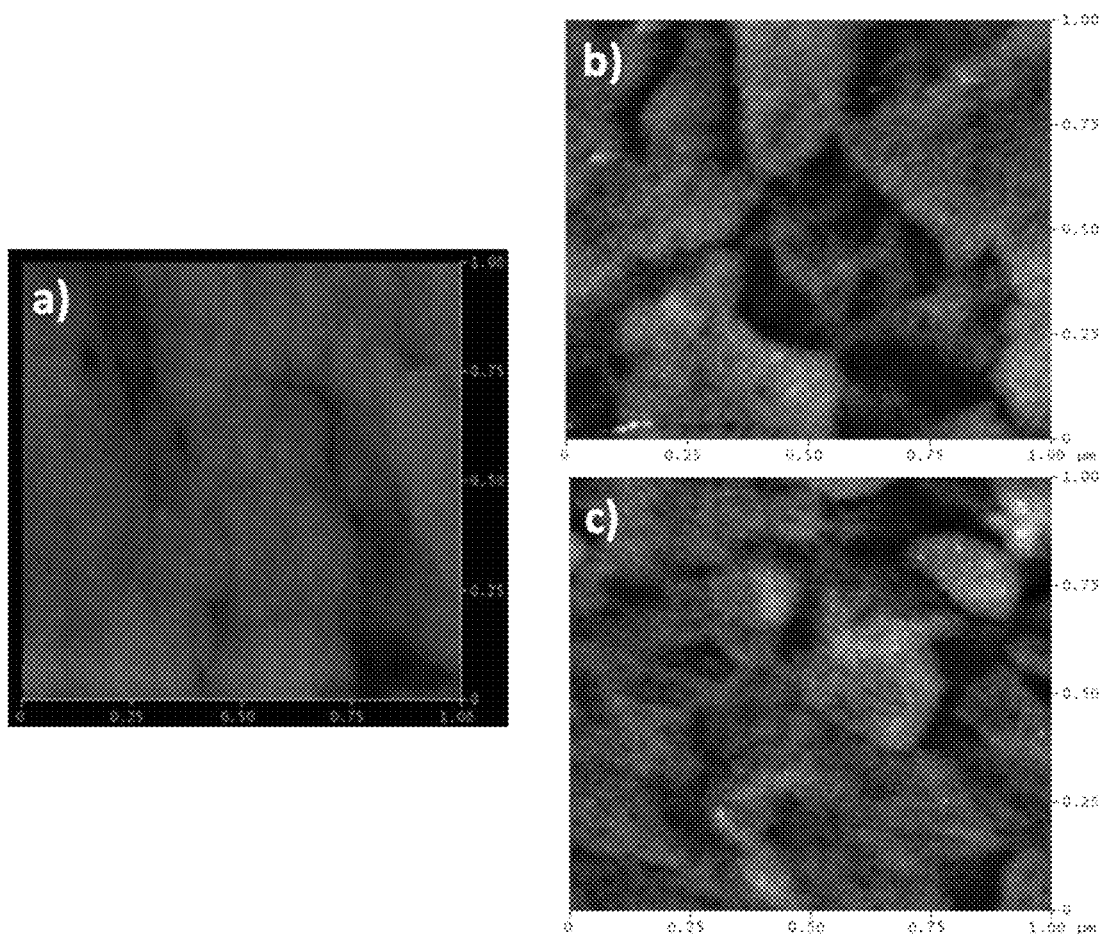
FIG. 1 shows the morphology of (a) pure ITO; (b) $MoO_3$ film coated onto ITO from ammonium molydate ink; and (c) hybridized $MoO_3$ film coated onto ITO from ammonium molydate ink with $ZnCl_2$. Scan area is 1×1 μm.

The following detailed description refers to the accompanying drawings that show, by way of illustration, specific details and embodiments in which the invention may be practised. These embodiments are described in sufficient detail to enable those skilled in the art to practise the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Present inventors have developed solution-based methods of forming molybdenum (VI) oxide ($MoO_3$) films for optoelectronic applications, such as but not limited to, organic photovoltaic (OPV) devices. In present methods, a combination of additives to prepare $MoO_3$ films from inks is used, and such preparation methods have helped to improve the performance of OPV devices.

$MoO_3$ films are prepared from ammonium molybdate inks with soluble inorganic salts as additives, producing comparable cell performances at a less acidic ink condition. The solution-processable $MoO_3$ film is environment friendly since water is employed as the formulation solvent. The formation of the $MoO_3$ film is processed at relatively low temperatures for a short period of time. By applying the $MoO_3$ film as a hole-transporting layer in OPV devices, the overall solar cell efficiency can be improved.

Thus, in a first aspect, the present invention relates to an ink for forming a hybrid $MoO_3$ film on a substrate. The ink comprises an ammonium molybdate, at least one inorganic salt different from ammonium molybdate, and a solvent or a solvent mixture.

In various embodiments, the ammonium molybdate may be selected from the group consisting of ammonium heptamolybdate $((NH_4)_6Mo_7O_{24})$, ammonium dimolybdate $((NH_4)_2Mo_2O_7)$, ammonium orthomolybdate $((NH_4)_2MoO_4)$, $(NH_4)_4Mo_5O_{17}$, $(NH_4)_2Mo_4O_{13}$, β-$(NH_4)_2Mo_4O_{13}$, $(NH_4)_4Mo_8O_{26}$, $(NH_4)_4Mo_8O_{26}$, $(NH_4)_2Mo_{14}O_{43}$, $(NH_4)_2Mo_{22}O_{67}$ and hydrates thereof.

In one embodiment, the ammonium molybdate is $(NH_4)_6Mo_7O_{24}$.

In various embodiments, the inorganic salts comprise soluble inorganic salts containing transition metal ions and counter ions. In various embodiments, the inorganic salt is a metal halide. The metal can be selected from zinc, calcium, beryllium, magnesium, strontium, barium, radium, cadmium, mercury, and copernicium. The halogen ion can be selected from fluoride, chloride, bromide and iodide. In particular, the metal halide can be selected from the group consisting of zinc chloride, zinc bromide, zinc iodide, calcium chloride, calcium bromide, calcium iodide, beryllium chloride, beryllium bromide, beryllium iodide, magnesium chloride, magnesium bromide, magnesium iodide, strontium chloride, strontium bromide, strontium iodide, barium chloride, barium bromide, barium iodide, radium chloride, radium bromide, radium iodide, cadmium chloride, cadmium bromide, cadmium iodide, mercury chloride, mercury bromide, mercury iodide, copernicium chloride, copernicium bromide, and copernicium iodide.

In one embodiment, the inorganic salt may be zinc chloride or calcium chloride.

In various embodiments, the solvent is a polar solvent selected from the group consisting of water, alcohols, furan, esters, acetonitrile, acetone, dimethylformamide, dimethyl sulfoxide and mixture thereof.

In one embodiment, the solvent is water.

In alternative embodiments, the solvent is furan or an alcohol.

In various embodiments, the ink further comprises an acid. The acid may be selected from the group consisting of hydrogen chloride, hydrogen bromide, hydrogen iodide, sulfuric acid, nitric acid, chloric acid, chlorous acid, sulfurous acid, hydrocyanic acid, perchloric acid, phosphoric acid, hypophosphorous acid, and boric acid.

In one specific embodiment, the acid is hydrogen chloride.

In various embodiments, the pH of the ink is at least 1. For example, the pH of the ink may be 1, 1.5, 2, 2.5, 3, 3.3, 4, 4.5, 5, 5.3, or 6 and even higher.

In a second aspect, the present invention relates to a method of preparing a $MoO_3$ coating ink of the first aspect, the method comprising (i) mixing a molybdate compound and an inorganic salt in a solution, or (ii) mixing a solution of molybdate compound and an inorganic salt, or (iii) mixing a molybdate compound and a solution of an inorganic salt, or (iv) mixing a solution of a molybdate compound and a solution of an inorganic salt.

In various embodiments, the method of preparing the molybdenum oxide coating ink further comprises adding an acid to the mixture. The acid may be selected from the group consisting of hydrogen chloride, hydrogen bromide, hydrogen iodide, sulfuric acid, nitric acid, chloric acid, chlorous acid, sulfurous acid, hydrocyanic acid, perchloric acid, phosphoric acid, hypophosphorous acid, and boric acid.

In a third aspect, the present invention relates to a method of forming a hybrid MoO₃ film on a substrate, the method comprising coating the substrate with an ink according to the first aspect to form a film, and annealing the film.

In various embodiments, coating the substrate is solution-based. For example, the solution-based coating and/or printing technique may be selected from the group consisting of spin coating, slot die coating, inkjet printing, dispensing, spray coating, blade coating, doctor blading, knife coating, curtain coating, gravure printing, flexo printing, offset printing, screen printing, and pad printing.

Figure 6:
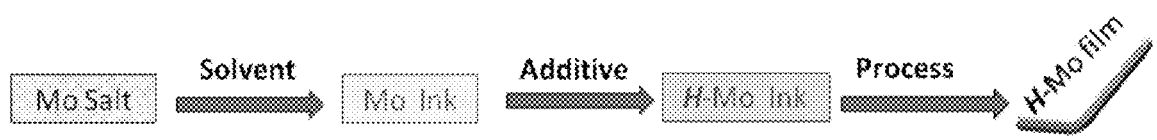
FIG. 6 shows a scheme showing the method for the preparation of hybridized molybdenum oxide (H—Mo) films.
Figure 7:
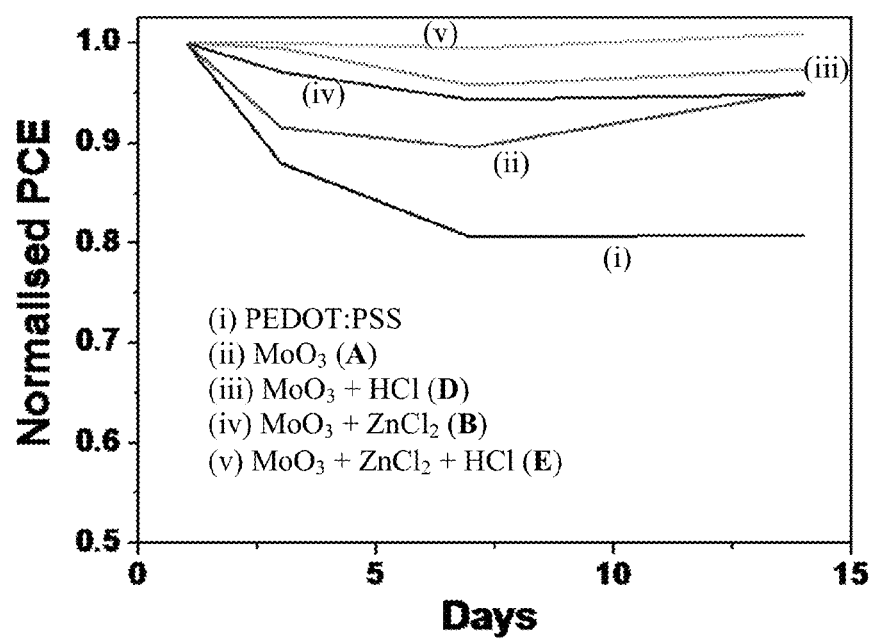
FIG. 7 shows preliminary lifetime studies, demonstrating that H—$MoO_3$ OPV devices are generally more stable.

In one embodiment, FIG. 6 shows a scheme showing the method for the preparation of hybridized MoO₃ (H—Mo) films. Briefly, a molybdenum compound or salt (e.g. $(NH_4)_6Mo_7O_{24}$ which is a cheap and commercially available salt) is first dissolved in a solvent (e.g. water which is green and sustainable) to form a Mo ink. Next, common salts additives such as $ZnCl_2$ or $CaCl_2$ (which are cheap and easily available) are added to the Mo ink to form a H—Mo (hybrid) ink. The H—Mo ink is then processed, for example using printing and coating techniques described above, to make OPV devices. The thus-fabricated OPV devices may be rigid or flexible. The entire process is conducted at low process temperature with a high throughput and the advantages in employing such process include a green, low-cost technique, and solution-based printable technique, yielding improved OPV device efficiency and life time. Additionally, the H—Mo ink can be processed before or after forming the active layer depending on the normal or inverted OPV configuration, which gives great flexibility and advantage for OPV fabrication and performance optimization.

In one embodiment, the ink may be slot die coated onto the substrate.

In various embodiments, the substrate may be flexible or rigid.

In various embodiments, the substrate may be glass, paper/synthetic paper and plastic films such as PEN, PET, or polyimide.

In one embodiment, the substrate may be indium tin oxide (ITO) patterned glass substrate.

In various embodiments, the film may be annealed at a temperature between 50 and 500° C.

In various embodiments, the thickness of the film may be at least 1 nm. For example, the thickness of the film may be 1 nm, 10 nm, 25 nm, 50 nm, 75 nm, 100 nm, 125 nm, 150 nm, 175 nm, 200 nm, 300 nm, 400 nm, 500 nm, 600 nm, 700 nm, 800 nm, 900 nm, 1 µm and even higher.

In a fourth aspect, the present invention relates to the hybrid MoO₃ film coated substrate prepared according to the third aspect.

In a fifth aspect, the present invention relates to an optoelectronic device comprising the hybrid MoO₃ film coated substrate according to the fourth aspect. The optoelectronic device can be formed of a normal configuration or an inverted configuration.

Figure 2A:
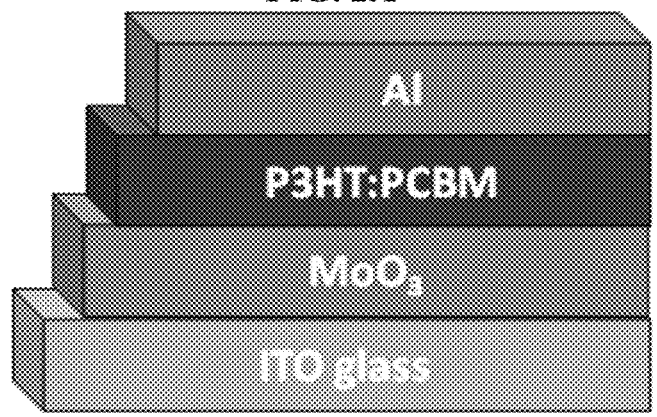
FIG. 2 shows the cross-section of the OPV device under investigation. The OPV device can be formed of a normal (or forward) structure configuration shown in FIG. 2A where different types of hybridized $MoO_3$ films functioning as the hole-transporting layer were coated onto ITO glass. The OPV device can also be formed of an inverted structure configuration shown in FIG. 2B.

In a normal configuration optoelectronic device, the conductive substrate (i.e. substrate with a conductive coating) forms the anode and the hybrid MoO₃ film forms the hole-transporting layer (conductive layer; charge transport layer). The optoelectronic device may further comprise an active layer formed on the MoO₃ film and a cathode layer. As illustrated in FIG. 2A, the structure sequence of the normal configuration optoelectronic device is anode/hole-transporting layer/active layer/cathode.

In one embodiment of such a device, the conductive substrate forming the anode may comprise or consist of ITO.

In one embodiment, the active layer may be poly(3-hexylthiophene) and [6,6]-phenyl C61-butyric acid methyl ester (P3HT:PCBM).

In one embodiment, the cathode layer may be aluminium metal.

In an inverted configuration optoelectronic device, the device comprises a cathode, an electron transporting layer formed on the cathode, an active layer formed on the electron transporting layer, the hybrid MoO₃ film forming a hole transporting layer formed on the active layer, and an anode formed on the hybrid MoO₃ film. In the specific embodiment illustrated in FIG. 2B, the structure sequence of the inverted configuration optoelectronic device is ITO glass/ZnO/P3HT:PCBM/H—MoO₃/Ag wherein the cathode is ITO glass, the electron transport layer is ZnO, the active layer is P3HT:PCBM and the anode is Ag.

In various embodiments, the optoelectronic device may be a printed electronic device, sensor, or chromic window.

In certain embodiments, the optoelectronic device may be a printed electronic device. For example, the printed electronic device may be a photoelectrical device, photoelectrical sensor, photovoltaic, organic photovoltaic, thin film transistor, organic thin film transistor, light emitting device, light emitting diode, organic light emitting diode, thermochromic, photochromic, electrochromic, or optoelectric sensor related optoelectronic devices.

In various embodiments, the inorganic material of the photoelectrical device, photoelectrical sensor, photovoltaic, thin film transistor, light emitting device, light emitting diode, thermochromic, photochromic, electrochromic, optoelectric sensor related optoelectronic devices may be inorganic functional materials.

In various embodiments, the organic material of the photoelectrical device, photoelectrical sensor, photovoltaic, thin film transistor, light emitting device, light emitting diode, thermochromic, photochromic, electrochromic, optoelectric sensor related optoelectronic devices may be small molecules or polymeric materials.

In various embodiments, the hybrid material of the photoelectrical device, photoelectrical sensor, photovoltaic, thin film transistor, light emitting device, light emitting diode, thermochromic, photochromic, electrochromic, optoelectric sensor related optoelectronic devices includes a combination of inorganic and organic functional materials.

In various embodiments, the optoelectronic device may be of normal configuration or inverted configuration.

In one illustrated embodiment, a PCE comparable to our control cells, using PEDOT:PSS as the hole-transporting layer, has been achieved. Utilizing a combination of HCl and $ZnCl_2$ as additives yields a PCE of 3.09%. This value is comparable to our control OPV device, which has a PCE of 3.14% (see Table 3 below).

In order that the invention may be readily understood and put into practical effect, particular embodiments will now be described by way of the following non-limiting examples.

EXAMPLES

Example 1

Preparation of Hybridized MoO₃ Films and their Analysis

The procedure to prepare hybridized MoO₃ films is described in FIG. 6. 230.8 mg of $(NH_4)_6Mo_7O_{24}$ was dissolved in 10 ml of water to attain a concentration of 0.3 M. This ink was marked as A and its pH value is 5.3. Next, 60 µl of aqueous zinc chloride ($ZnCl_2$) was added to ink A. This ink was marked as B and its pH value is 5.3. Both inks were spin-coated onto indium tin oxide (ITO) substrates.

The films were analyzed by atomic force microscopy (AFM), which revealed that the molybdenum oxide films were deposited onto the ITO substrate surface. A significant change in the morphology is observed. AFM images seem to suggest that there is a roughening of the ITO surface after the films are fabricated (FIG. 1). The thickness of the films is 10 nm, which was determined by ellipsometry.

Example 2

Study of OPV Devices with Molybdenum Oxide Film as the Hole-Transporting Layer

In this example, an OPV device having a normal configuration is first described. Both P3HT and PCBM were dissolved in 1,2-dichlorobenzene (DCB) solution in a ratio of 1:0.8. Devices were prepared on ITO patterned glass substrate. The ITO patterned glass substrates were first sonicated in a detergent bath for half an hour, followed by a rinsing of de-ionized water for 20 min. This was succeeded by sonicating in an acetone and isoproponal bath for 15 min and 20 min, respectively. The cleaning step was concluded by drying the substrates in an oven at 80° C. for at least an hour. The substrates were subjected to an ozone plasma treatment for 10 min before the $MoO_3$ inks were spin-coated. Annealing was done at 150° C. for 10 min. Ellipsometric data reveals that the thickness of the $MoO_3$ layers was approximately 10 nm. Annealing was performed at 120° C. for 10 min. Next, the active layer of P3HT:PCBM was spin-coated and allowed to dry for 2 hours before being annealed at 120° C. for 10 min, yielding a film thickness of ~200 nm. Lastly, a 100 nm thick Al as the cathode were deposited via an MBraun evaporation system at a pressure less than $10^{-3}$ Pa. The active area of the device was 9 $mm^2$. The device structure is shown in FIG. 2A. For the control device, a 45 nm thick PEDOT:PSS was spin-coated onto the ITO surface. Pure $MoO_3$ ink is prepared directly from $(NH_4)_6Mo_7O_{24}$.

Figure 2B:
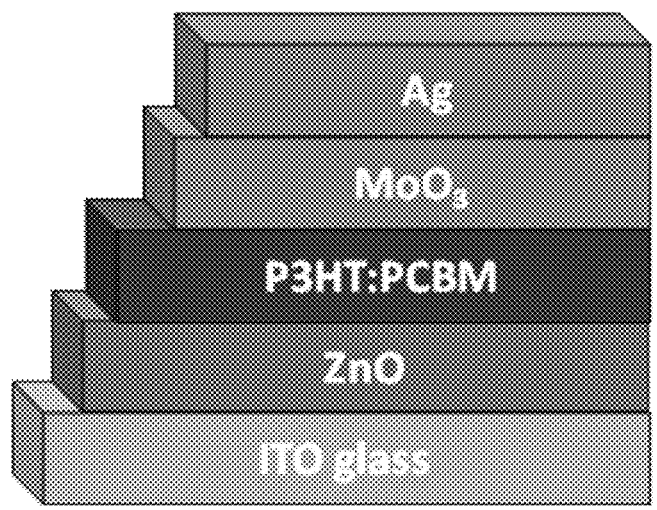

In an alternative embodiment, an inverted configuration OPV device is shown in FIG. 2B. In this embodiment, the structure sequence consists of ITO glass/ZnO/P3HT:PCBM/H—$MoO_3$/Ag (i.e. cathode/electron transporting layer/active layer/hole transporting layer/anode). The H—Mo ink can be processed before or after forming the active layer depending on the normal or inverted OPV configuration, which gives great flexibility and advantage for OPV fabrication and performance optimization.

For the purposes of illustration, the examples and experimental results described herein relate to normal configuration OPV devices, unless stated otherwise.

Figure 3:
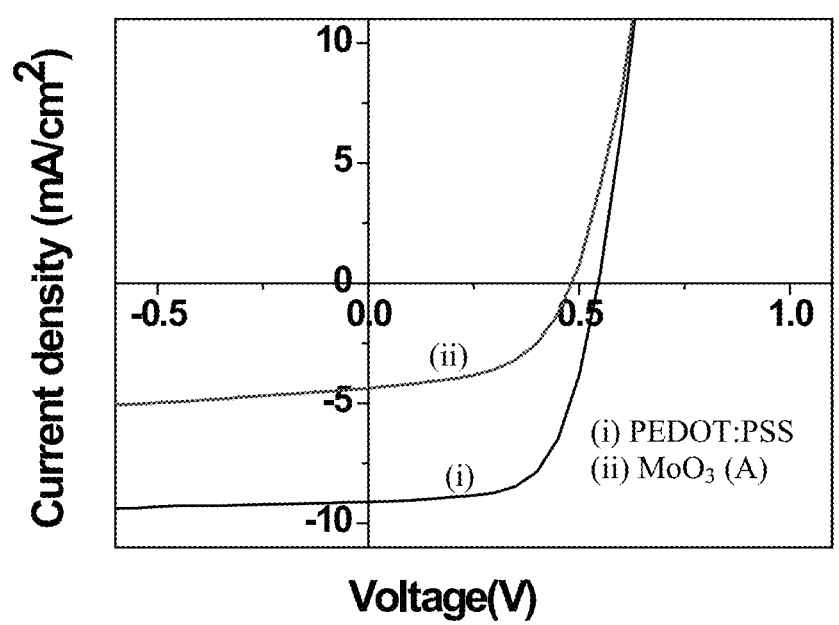
FIG. 3 shows the comparison of cell performances with pure $MoO_3$ film as the hole-transporting layer (marked as A) and a PEDOT:PSS control device.

The I-V curves are shown in FIG. 3 and the cell performance results are summarized in Table 1. Upon replacing PEDOT:PSS with $MoO_3$ film prepared from ammonium molybdate ink, the power conversion efficiency (PCE) drops from 3.14% to 1.12% (Table 1, A).

TABLE 1

Cell Performances of OPV Devices with Pure $MoO_3$ Film as the Hole-Transporting Layer (A) and PEDOT:PSS

|  | $V_{oc}$ (V) | $J_{sc}$ (mA/cm2) | FF | PCE (%) |
|---|---|---|---|---|
| PEDOT:PSS (Control) | 0.55 | 9.10 | 0.63 | 3.14 |
| A | 0.48 | 4.38 | 0.53 | 1.12 |

Example 3

Study of OPV Devices with Hybridized Molybdenum Oxide Films as the Hole-Transporting Layer (Part 1)

Figure 4:
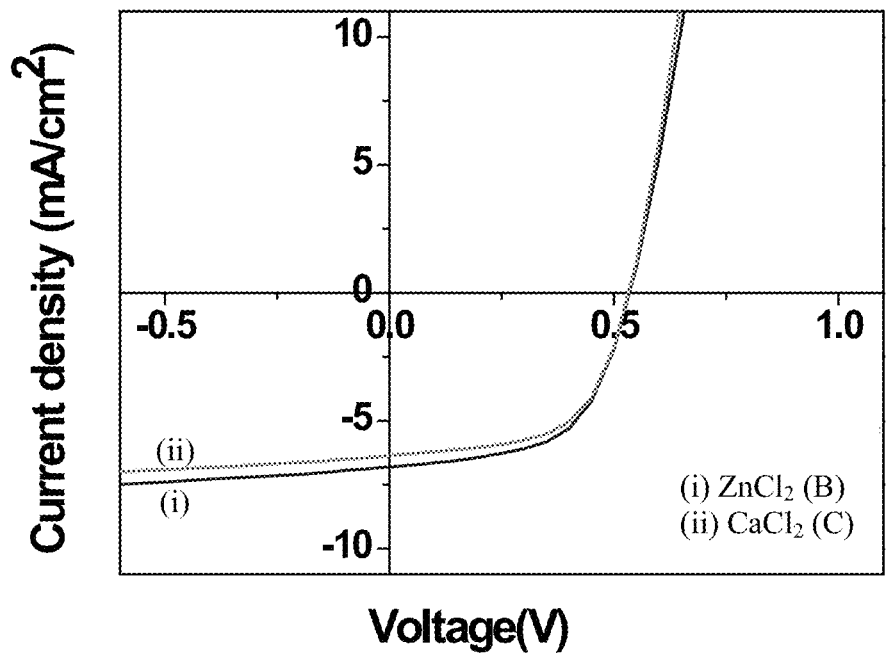
FIG. 4 shows the comparison of cell performances with $MoO_3$ films as the hole-transporting layer: $MoO_3$ film (B) prepared from ammonium molybdate ink with $ZnCl_2$ additive; $MoO_3$ film (C) prepared from ammonium molybdate ink with $CaCl_2$ additive.

The trend can be reversed in Example 2 if the $MoO_3$ film is hybridized. They are prepared as ink B and ink C, which has a pH value of 5.3 and 5.2, respectively Ink B was prepared from ammonium molybdate ink with $ZnCl_2$ as the additive. The I-V curves are plotted in FIG. 4 and the figures merits are summarized in Table 2. An improvement is observed, with its PCE rising to 2.12% (Table 2, B). The cell efficiency was improved by 89%. An 80% improvement in the cell performance can be observed by hybridizing $MoO_3$ with $CaCl_2$ additive (Table 2, C). In this case, a PCE of 2.02% is obtained.

TABLE 2

Cell Performances of OPV Devices with $MoO_3$ Films as the Hole-Transporting Layer.

|  | $V_{oc}$ (V) | $J_{sc}$ (mA/cm$^2$) | FF | PCE (%) |
|---|---|---|---|---|
| PEDOT:PSS (Control) | 0.55 | 9.10 | 0.63 | 3.14 |
| A | 0.48 | 4.38 | 0.53 | 1.12 |
| B | 0.53 | 6.81 | 0.58 | 2.12 |
| C | 0.53 | 6.36 | 0.60 | 2.02 |

Ink B is marked as $MoO_3$ film prepared from ammonium molybdate ink with $ZnCl_2$ additive;
Ink C is marked as $MoO_3$ film prepared from ammonium molybdate ink with $CaCl_2$ additive.

Example 4

Study of OPV Devices with Hybridized Molybdenum Oxide Films as the Hole-Transporting Layer (Part 2)

In this example, $MoO_3$ films were prepared as ink D and ink E, having a pH value of 3.6 and 3.5, respectively.

Figure 5:
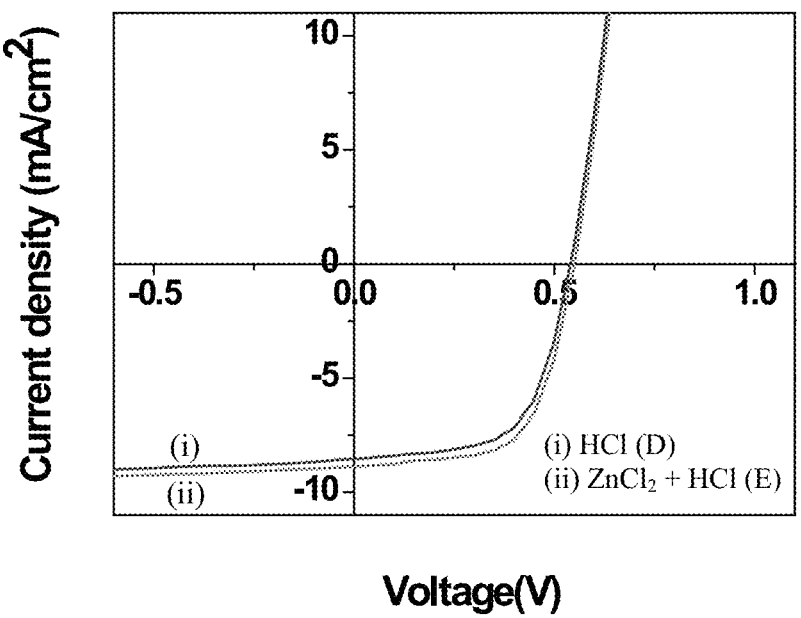
FIG. 5 shows the comparison of cell performances with $MoO_3$ films as the hole-transporting layer: $MoO_3$ film (D) prepared from ammonium molybdate ink with HCl; $MoO_3$ film (E) prepared from ammonium molybdate ink with HCl and $ZnCl_2$ additive.

In a bid to further improve the performance of $MoO_3$-based OPV cells, HCl as an additive was introduced. It has been found that efficiency of OPV cells can be improved by using HCl as an additive. Two different samples were prepared for comparisons: HCl and HCl+$ZnCl_2$ as the additives in the ammonium molybdate inks. The thickness of the P3HT:PCBM layer was kept the same as the data in Table 2. As shown in Table 3 below, a further improvement is observed. The I-V curves are plotted in FIG. 5. In fact, by using $MoO_3$ films prepared from ammonium molybdate ink with a combination of HCl and $ZnCl_2$ additives, OPV performance was elevated a notch further as compared to a system when only HCl as additive to ammonium molybdate ink was used. An increase in the PCE from 2.86% to 3.09% has shown that it is possible to further enhance the performance of OPV devices by utilizing a blend of HCl and a salt compound. In fact, results are comparable to the control cell, which uses PEDOT:PSS in Table 1.

TABLE 3

Cell Performances of OPV Devices with $MoO_3$ Films as the Hole-Transporting Layer.

|  | $V_{oc}$ (V) | $J_{sc}$ (mA/cm2) | FF | PCE (%) |
|---|---|---|---|---|
| PEDOT:PSS (Control) | 0.55 | 9.10 | 0.63 | 3.14 |

TABLE 3-continued

Cell Performances of OPV Devices with MoO$_3$ Films as the Hole-Transporting Layer.

| | $V_{oc}$ (V) | $J_{sc}$ (mA/cm2) | FF | PCE (%) |
|---|---|---|---|---|
| A | 0.48 | 4.38 | 0.53 | 1.12 |
| D | 0.54 | 8.54 | 0.62 | 2.86 |
| E | 0.55 | 8.88 | 0.63 | 3.09 |

Ink D is marked as MoO$_3$ film prepared from ammonium molybdate ink with HCl; Ink E is marked as MoO$_3$ film prepared from ammonium molybdate ink with HCl and ZnCl$_2$ additive.

Based on the promising results above, present inventors have demonstrated that there is an alternative to PEDOT:PSS as the hole-transporting layer. In fact, further optimization by exploring the usage of other salt compounds could even further raise the performance of OPV devices. Such a method could mean a potential replacement of PEDOT:PSS in the future.

It has to be emphasized about the role of ZnCl$_2$ in the HCl and ZnCl$_2$ combination for the cell performance. ZnCl$_2$ helps to improve the cell efficiency by 8%. At the same time, PEDOT:PSS has a pH value of ~1.6 while MoO$_3$ hybridized with HCl and ZnCl$_2$ has helped to lift the pH value to 3.5 The usage of other salts such as CaCl$_2$ can be expected to produce the same observation as well.

By "comprising" it is meant including, but not limited to, whatever follows the word "comprising". Thus, use of the term "comprising" indicates that the listed elements are required or mandatory, but that other elements are optional and may or may not be present.

By "consisting of" is meant including, and limited to, whatever follows the phrase "consisting of". Thus, the phrase "consisting of" indicates that the listed elements are required or mandatory, and that no other elements may be present.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

By "about" in relation to a given numerical value, such as for temperature and period of time, it is meant to include numerical values within 10% of the specified value.

The invention has been described broadly and generically herein. Each of the narrower species and sub-generic groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

The invention claimed is:

1. An ink for forming a hybrid molybdenum (VI) oxide (MoO$_3$) film on a substrate, the ink comprising:
   an ammonium molybdate;
   at least one inorganic salt different from ammonium molybdate; and
   a solvent or a solvent mixture,
   wherein the at least one inorganic salt is a metal halide selected from the group consisting of zinc chloride, zinc bromide, zinc iodide, calcium chloride, calcium bromide, calcium iodide, beryllium chloride, beryllium bromide, beryllium iodide, magnesium chloride, magnesium bromide, magnesium iodide, strontium chloride, strontium bromide, strontium iodide, barium chloride, barium bromide, barium iodide, radium chloride, radium bromide, radium iodide, cadmium chloride, cadmium bromide, cadmium iodide, mercury chloride, mercury bromide, mercury iodide, copernicium chloride, copernicium bromide, and copernicium iodide.

2. The ink of claim 1, wherein the ammonium molybdate is selected from the group consisting of ammonium heptamolybdate ((NH$_4$)$_6$Mo$_7$O$_{24}$), ammonium dimolybdate ((NH$_4$)$_2$Mo$_2$O$_7$), ammonium orthomolybdate ((NH$_4$)$_2$MoO$_4$), (NH$_4$)$_4$Mo$_5$O$_{17}$, (NH$_4$)$_2$Mo$_4$O$_{13}$, β-(NH$_4$)$_2$Mo$_4$O$_{13}$, (NH$_4$)$_4$Mo$_8$O$_{26}$, (NH$_4$)$_4$Mo$_8$O$_{26}$, (NH$_4$)$_2$Mo$_{14}$O$_{43}$, (NH$_4$)$_2$Mo$_{22}$O$_{67}$ and hydrates thereof.

3. The ink of claim 2, wherein the ammonium molybdate is (NH$_4$)$_6$Mo$_7$O$_{24}$.

4. The ink of claim 1, wherein the at least one inorganic salt is zinc chloride or calcium chloride.

5. The ink of claim 1, wherein the solvent is a polar solvent selected from the group consisting of water, alcohols, furan, esters, acetonitrile, acetone, dimethylformamide, dimethyl sulfoxide and mixture thereof.

6. The ink of claim 5, wherein the solvent is water.

7. The ink of claim 1, further comprising an acid.

8. The ink of claim 7, wherein the acid is selected from the group consisting of hydrogen chloride, hydrogen bromide, hydrogen iodide, sulfuric acid, nitric acid, chloric acid, chlorous acid, sulfurous acid, hydrocyanic acid, perchloric acid, phosphoric acid, hypophosphorous acid, and boric acid.

9. The ink of claim 8, wherein the acid is hydrogen chloride.

10. The ink of claim 1, wherein the pH of the ink is at least 1.

11. A method for preparing a molybdenum (VI) oxide (MoO$_3$) coating ink, the method comprising:
    mixing a molybdate compound and an inorganic salt in a solution;
    mixing a solution of molybdate compound and an inorganic salt;
    mixing a molybdate compound and a solution of an inorganic salt; or
    mixing a solution of a molybdate compound and a solution of an inorganic salt;
    wherein the inorganic salt is a metal halide selected from the group consisting of zinc chloride, zinc bromide, zinc iodide, calcium chloride, calcium bromide, calcium iodide, beryllium chloride, beryllium bromide, beryllium iodide, magnesium chloride, magnesium bromide, magnesium iodide, strontium chloride, strontium bromide, strontium iodide, barium chloride, barium bromide, barium iodide, radium chloride, radium bromide, radium iodide, cadmium chloride, cadmium bromide, cadmium iodide, mercury chloride, mercury bromide, mercury iodide, copernicium chloride, copernicium bromide, and copernicium iodide.

12. The method of claim 11, further comprising adding an acid to the mixture.

13. The method of claim 12, where the acid is selected from the group consisting of hydrogen chloride, hydrogen bromide, hydrogen iodide, sulfuric acid, nitric acid, chloric acid, chlorous acid, sulfurous acid, hydrocyanic acid, perchloric acid, phosphoric acid, hypophosphorous acid, and boric acid.

\* \* \* \* \*